(12) United States Patent
Hong et al.

(10) Patent No.: US 10,044,336 B2
(45) Date of Patent: Aug. 7, 2018

(54) APPARATUS FOR PREVENTING NOISE IN ELECTRONIC DEVICE

(71) Applicant: Samsung Electronics Co., Ltd., Gyeonggi-do (KR)

(72) Inventors: Sungbin Hong, Seoul (KR); Hojun Kim, Gyeonggi-do (KR); Kyungmin Park, Gyeonggi-do (KR); Jin-Hee Won, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/403,712

(22) Filed: Jan. 11, 2017

(65) Prior Publication Data

US 2017/0230023 A1 Aug. 10, 2017

(30) Foreign Application Priority Data

Feb. 4, 2016 (KR) .................. 10-2016-0014159

(51) Int. Cl.
*H03G 3/34* (2006.01)
*H04R 1/10* (2006.01)

(52) U.S. Cl.
CPC .......... *H03G 3/348* (2013.01); *H04R 1/1041* (2013.01)

(58) Field of Classification Search
CPC .................. H04R 1/1041; H03G 3/348
See application file for complete search history.

(56) References Cited

U.S. PATENT DOCUMENTS

| 6,397,087 | B1 | 5/2002 | Kim et al. | |
|---|---|---|---|---|
| 2012/0140956 | A1* | 6/2012 | Poulsen | H04R 1/04 381/111 |
| 2012/0317314 | A1* | 12/2012 | Choi | H04M 1/72527 710/8 |
| 2014/0064512 | A1* | 3/2014 | Yu | H01R 24/58 381/74 |
| 2015/0349464 | A1* | 12/2015 | Hogan | H01R 13/7039 439/620.21 |
| 2016/0035342 | A1* | 2/2016 | Lee | G10K 11/1788 381/309 |
| 2016/0309251 | A1* | 10/2016 | Poulsen | H04R 1/08 |
| 2017/0230747 | A1* | 8/2017 | Song | H04R 1/1083 |

* cited by examiner

*Primary Examiner* — Brenda C Bernardi
(74) *Attorney, Agent, or Firm* — The Farrell Law Firm, P.C.

(57) ABSTRACT

The present disclosure relates to an apparatus for preventing noise in an electronic device. An apparatus for preventing noise in an electronic device includes a microphone unit including a microphone, the microphone unit connected to a first power terminal and a second power terminal, and a switch unit including at least one switch and at least one resistance, the switch unit connected to the first power terminal and the microphone in series.

19 Claims, 8 Drawing Sheets

| BAND | GSM900 | | GSM850 | | | | DCS1800 | | | PCS1900 | | |
|---|---|---|---|---|---|---|---|---|---|---|---|---|
| Channel | 975 | 38 | 124 | 128 | 190 | 251 | 512 | 698 | 885 | 512 | 661 | 810 |
| Earphone Before Improvement (dB) | -71.0 | -73.02 | -72.15 | -73.09 | -78.45 | -75.51 | -78.18 | -77.86 | -78.59 | -75.48 | -75.56 | -74.99 |
| Earphone After Improvement (dB) | -89.62 | -89.26 | -89.39 | -84.88 | -84.31 | -83.33 | -82.53 | -83.26 | -83.01 | -86.33 | -86.34 | -86.29 |

FIG.8

APPARATUS FOR PREVENTING NOISE IN ELECTRONIC DEVICE

PRIORITY

This application claims priority under 35 U.S.C. § 119(a) to Korean Patent Application Serial No. 10-2016-0014159, which was filed in the Korean Intellectual Property Office on Feb. 4, 2016, the entire content of which is incorporated herein by reference.

BACKGROUND

1. Field of the Disclosure

The present disclosure relates generally to an apparatus for preventing noise in an electronic device (e.g., earphone).

2. Description of the Related Art

The electronic device (e.g., an earphone) provides a function of transferring a voice output from an external electronic device to a user or transferring the user's request to the external electronic device. For example, when an earphone including a plurality of keys is connected to an external electronic device communicating with a counterpart and a user selects one of the plurality of keys, the earphone may transmit a signal to the external electronic device so that the external electronic device performs a function corresponding to the selected key.

However, in the electronic device (e.g., an earphone), noise is generated by the key selection by the user. When the noise by the key selection is generated while a communication is performed between the external electronic device and the counterpart, the communication quality may be reduced by the noise. Such noise may be frequently generated in a weak electric field of a second communication system.

SUMMARY

The present disclosure has been made to address at least the above-mentioned problems and/or disadvantages and to provide at least the advantages described below.

Accordingly, an aspect of the present disclosure is to remove or reduce noise generated by the selection of a key of an electronic device (e.g., an earphone).

Accordingly, another aspect of the present disclosure is to change a circuit structure of an electronic device, thereby preventing noise from being generated by the selection of a key of the electronic device.

In accordance with an aspect of the present disclosure, an apparatus for preventing noise in an electronic device is provided. The apparatus includes a microphone unit including a microphone, the microphone connected to a first power terminal and a second power terminal, and a switch unit including at least one switch and at least one resistance, the switch unit connected to the first power terminal and the microphone in series.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION OF EMBODIMENTS OF THE PRESENT DISCLOSURE

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements.

As used herein, the expressions "have", "may have", "include", and "may include" refer to the existence of a corresponding feature (e.g., a numeral, function, operation, or constituent element such as component), and do not exclude one or more additional features.

In the present disclosure, the expressions "A or B", "at least one of A or/and B", and "one or more of A or/and B" may include all possible combinations of the items listed. For example, the expressions "A or B", "at least one of A and B", and "at least one of A or B" may refer to (1) including A, (2) including B, or (3) including both A and B.

The expressions "a first", "a second", "the first", and "the second" used in describing various embodiments of the present disclosure may modify various elements regardless of the order and/or the importance but do not limit the corresponding elements. For example, a first user device and a second user device indicate different user devices regardless of the order and/or the importance. For example, a first element may be referred to as a second element, and similarly, a second element may be referred to as a first element without departing from the scope of the present disclosure.

When it is mentioned that one element (e.g., a first element) is "coupled" or "connected" with/to another element (e.g., a second element), it should be construed that the first element is directly connected to the second element or the first element is indirectly connected to the second element via another element (e.g., a third element). In contrast, it may be understood that when an element (e.g., first element) is referred to as being "directly connected," or "directly coupled" with/to another element (e.g., second element), there are no element (e.g., third element) interposed between the first and second elements.

The expression "configured to" used in the present disclosure may be used interchangeably with the expressions "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., an embedded processor) only for performing the corresponding operations or a generic-purpose processor (e.g., a central processing unit (CPU) or an application processor (AP)) that can perform the corresponding operations by executing one or more software programs stored in a memory device.

The terms used in the present disclosure are only used to describe specific embodiments, and are not intended to limit the present disclosure. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Terms such as those defined in a generally used dictionary may be interpreted to have meanings equal or similar to the contextual meanings in the relevant field of art, and are not to be interpreted to have ideal or excessively formal meanings unless clearly so defined in the present disclosure. In some cases, even a term defined in the present disclosure should not be interpreted to exclude embodiments of the present disclosure.

Hereinafter, an electronic device according to various embodiments will be described with reference to the accompanying drawings. In the present disclosure, the term "user" may indicate a person using an electronic device or a device (e.g., an artificial intelligence electronic device) using an electronic device.

Figure 1:
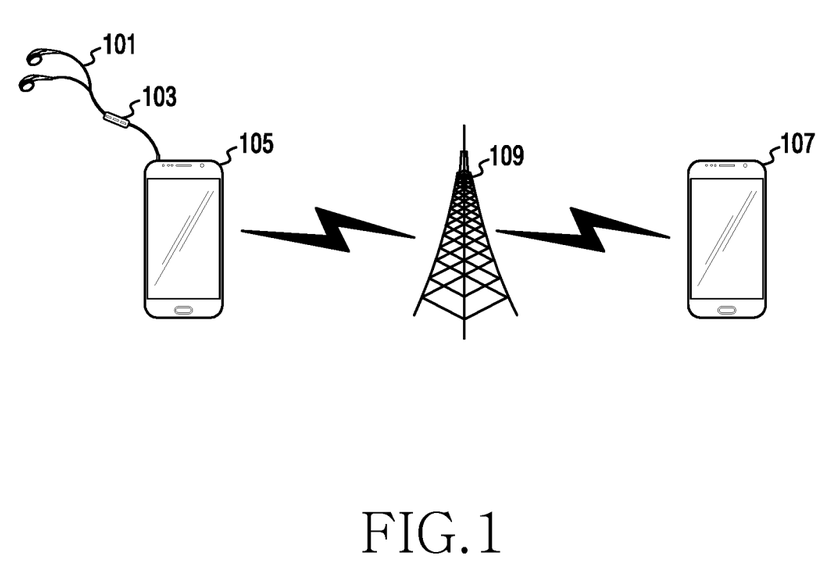
FIG. 1 illustrates a configuration of a communication system, according to an embodiment of the present disclosure.

FIG. 1 illustrates a configuration of a communication system, according to an embodiment of the present disclosure.

Referring to FIG. 1, a communication system is shown. The communication system may include a first electronic device 101 connected to a second electronic device 105, a third electronic device 107, and a base station 109. For example, the first electronic device 101 may be an earphone or a headphone.

The second electronic device 105 may connect a call to the third electronic device 107 through the base station 109, and transmit or receive a communication signal (e.g., a voice or image signal) to or from the third electronic device 107 through the connected call. Through transmitting or receiving the communication signal, a user of the second electronic device 105 may communicate with a user of the third electronic device 107 (e.g., a counterpart). For example, the second or third electronic device 105 or 107 may be a portable terminal which provides a communication function. As another example, the second or third electronic device 105 or 107 may be a wearable device (e.g., a smartwatch) which provides a communication function. As another example, the second electronic device 105 may be a portable terminal (e.g., a smartphone) having a body which is made of metal. For example, the rear surface, side surface, and/or front surface of the second electronic device 105 may be made of metal.

The first electronic device 101 may be electrically connected to the second electronic device 105. For example, the first electronic device 101 may be a 4-pole earphone and may be connected to the second electronic device 105 in a wired manner. The first electronic device 101 may include a plurality of keys 103 for controlling a communication function. For example, the plurality of keys 103 may include: a send/end key for accepting a communication request received from the third electronic device 107 or terminating a communication; a volume-up key (Vol+) for turning up the volume of a communication voice; and a volume-down key (Vol−) for turning down the volume of a communication voice.

When one of the plurality of keys 103 is selected by a user while the second electronic device 105 and the third electronic device 107 perform a communication function, the first electronic device 101 may change an electrical factor (e.g., a resistance value) corresponding to the selected key. The second electronic device 105, which is connected to the first electronic device 101, may identify the changed electrical factor and perform a communication function corresponding to the identified electrical factor. For example, when a volume-down key (Vol−) of an earphone 101 is selected by a user, the second electronic device 105 may identify a voltage value corresponding to the volume-down key, and perform a function of turning down the earphone volume of the second electronic device 105 on the basis of the identified voltage value.

The base station 109 may connect a call between the second electronic device 105 and the third electronic device 107 through a cellular communication system, and transmit a communication signal between the second electronic device 105 and the third electronic device 107 through the connected call. For example, the cellular communication system may be a second generation communication system. The second generation communication system may include at least one among a global system for mobile communications 850 (GSM850), GSM900, a digital communication system 1800 (DCS1800), and a personal communication system 1900 (PCS1900).

The third electronic device 107 may connect a call to the second electronic device 105 through the base station 109, and transmit or receive a communication signal to or from the second electronic device 105 (e.g., a portable terminal) through the connected call. Through transmitting or receiving the communication signal, a user of the third electronic device 107 may communicate with a user of the second electronic device 105.

When the second electronic device 105 is positioned in a weak electric field region of the base station 109, for example, a weak electric field region of the second communication system, the second electronic device 105 may transmit a transmission signal (e.g., a communication signal) to the base station 109 by transmission signal power of a RF unit which is higher than that of the RF unit when the second electronic device 105 is not positioned in the weak electric field. In this case, when one of the plurality of keys 103 of the first electronic device (e.g., an earphone) 101 is selected (e.g., pressed) by a user, the second electronic device 105 may transmit a signal (e.g., including a communication signal and noise), which includes noise caused by pressing a key of the first electronic device 101, to the third electronic device 107 through the base station 109. For example, when the noise caused by the pressing of the key of the first electronic device 101 is included in a frequency spectrum within the audible range (200 Hz to 1.5 kHz), the noise may be time division multiple access (TDMA) noise. For example, the TDMA noise may refer to voice noise.

The third electronic device 107 may receive a signal including the TDMA noise, and output a voice signal among the received signal through a speaker. However, since the output voice signal includes the TDMA noise, the third electronic device 107 may provide a communication function having an inferior communication quality to a user of the third electronic device 107. For example, since the TDMA noise may generate the same sound as that of a mosquito, the user of the third electronic device 107 may be dissatisfied with the communication quality. Additionally, the TDMA noise generated in the case where a body of the second electronic device 105 is made of metal sensitive to a radio wave may be louder than that generated in the case where the body of the second electronic device 105 is made of a plastic. For example, the intensity of the TDMA noise may become greater.

Accordingly, the present disclosure may change a circuit diagram of the first electronic device 101, thereby preventing TDMA noise from being generated in a weak electric field.

Figure 2:
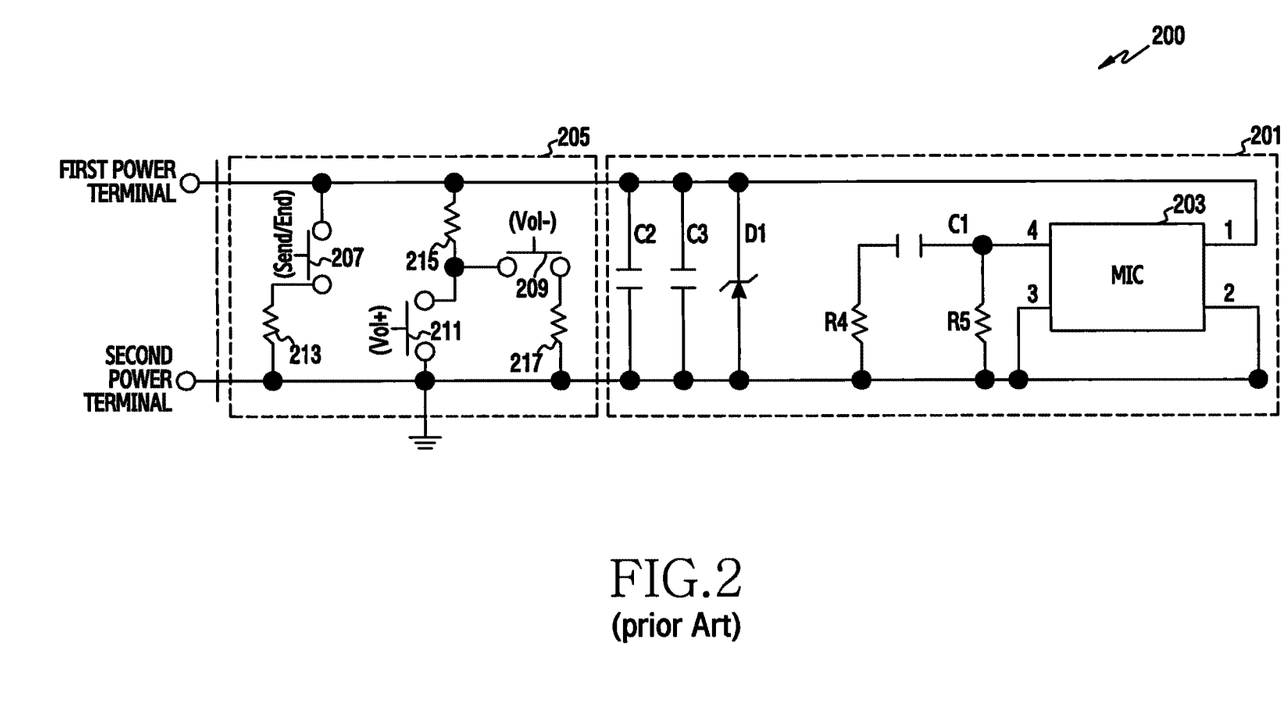
FIG. 2 is a prior art circuit diagram of a general first electronic device, according to the conventional art.

FIG. 2 is a prior art circuit diagram of a general first electronic device, according to the conventional art.

Referring to FIG. 2, a first electronic device 200 is shown. The first electronic device 200 may be the same type as the first electronic device 101 (e.g., an earphone) illustrated in FIG. 1. The first electronic device 200 may include a first power terminal, a second power terminal, a switch unit 205, and a microphone unit 201.

The microphone unit 201 may include at least one microphone 203, a plurality of resistances R4 and R5, a plurality of capacitors C1, C2, and C3, and at least one Zener diode D1. When the first electronic device 200 is connected to the second electronic device 105 (e.g., a portable terminal), the microphone unit 201 may receive a voice signal from a user by using the microphone 203, and transmit the received voice signal to the second electronic device 105. Further, the second electronic device 105 may transmit the received voice signal to the third electronic device 107 through the base station 109.

A value of the fourth resistance R4 may be 1.8 kΩ and a value of the fifth resistance R5 may be 15 kΩ The capacitance of the first capacitor C1 may be 1 μF, the capacitance of the second capacitor C2 may be 10 pF, and the capacitance of the third capacitor C3 may be 47 pF.

The switch unit 205 may include a plurality of switches 207, 209, and 211, and a plurality of resistances 213, 215, and 217 connected to the plurality of switches 207, 209, and 211. The plurality of switches 207, 209, and 211 may be switches which are closed when they are pressed.

The plurality of resistances may have different resistance values. For example, a value of the first resistance 213 may be 50Ω, a value of the second resistance 215 may be 270Ω, and a value of the third resistance 217 may be 357Ω.

Each of the plurality of switches 207, 209, and 211 may be connected, in series, to one of the plurality of resistances 213, 215, and 217. For example, the first switch 207 may be connected to the first resistance 213 in series, the second switch 209 may be connected to the second resistance 215 and the third resistance 217 in series, and the third switch 211 may be connected to the third resistance 217 in series.

The first electronic device 200 may include a plurality of keys similar to the plurality of keys 103 of the first electronic device 101, illustrated in FIG. 1. The plurality of keys may include one of the plurality of switches 207, 209, and 211 and at least one resistance connected to the one switch. For example, a send/end key may be configured by a combination of the first switch 207 and the first resistance 213. As another example, a volume-up key (Vol+) may be configured by a combination of the third switch 211 and the second resistance 215. As another example, a volume-down key (Vol−) may be configured by a combination of the second switch 209, the second resistance 215, and the third resistance 217.

The switch unit 205 and the microphone unit 201 may be connected to the first and second power terminals. The first power terminal may be a terminal which receives power supplied from the second electronic device 105, or a ground terminal which is connected to a ground of the second electronic device 105. Alternatively, the second power terminal may be a terminal which receives power supplied from the second electronic device 105, or a ground terminal which is connected to a ground of the second electronic device 105. When the first power terminal is a ground terminal, the second power terminal may be a terminal which is supplied with (−) power. When the second power terminal is a ground terminal, the first power terminal may be a terminal which is supplied with (+) power.

The second power terminal may be connected to one terminal of the first resistance 213, one terminal of the third switch 211, and one terminal of the third resistance 217 in the switch unit 205. Further, the second power terminal may be connected to one terminal of the second capacitor C2, one terminal of the third capacitor C3, an anode terminal of the Zener diode D1, one terminal of the fourth resistance R4, one terminal of the fifth resistance R5, and two terminals of the microphone 203 (e.g., terminals 3 and 4) in the microphone unit 201.

The first power terminal may be connected to one terminal of the first switch 207 and one terminal of the second resistance 215 in the switch unit 205. Further, the first power terminal may be connected to the remaining terminals of the second capacitor C2, the remaining terminals of the third capacitor C3, a cathode terminal of the Zener diode D1, and one terminal of the microphone 203 (e.g., terminal 1) in the microphone unit 201.

When a user selects (e.g., presses) one of the plurality of switches 207, 209, and 211 of the first electronic device 101, the first electronic device 101 may transmit to the second electronic device 105 a voice signal, which is output from the microphone unit 201 together with noise caused by pressing the switch.

Meanwhile, when the selected switch is closed, a closed loop may be formed from the second power terminal to the first power terminal, and noise ascending from the ground may be output to the first power terminal through the formed closed loop. For example, when the first switch 207 is closed, a closed loop may be formed from the second power terminal (e.g., a ground terminal) to the first power terminal through the first resistance 213 and the first switch 207, and noise ascending from the ground may be output to the first power terminal via the first resistance 213 and the first switch 207. If the first electronic device 101 is connected to the second electronic device 105, the output noise may be TDMA noise.

Figure 3:
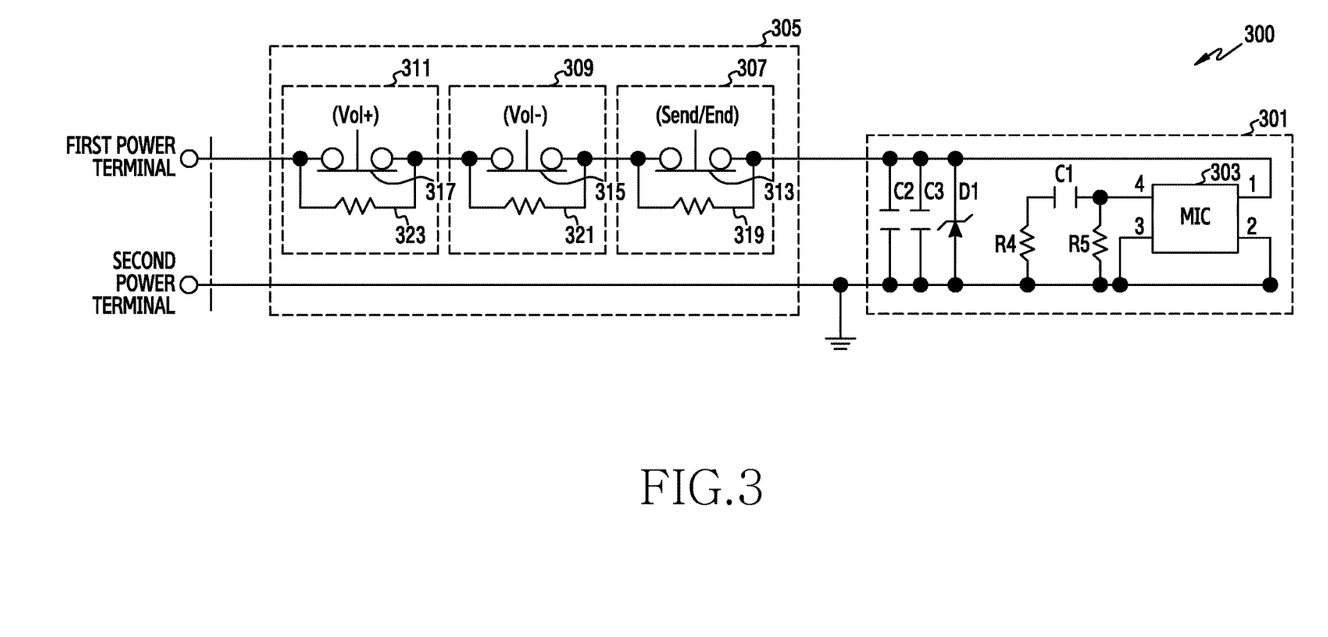
FIG. 3 is a circuit diagram of a first electronic device, according to an embodiment of the present disclosure.

FIG. 3 is a circuit diagram of a first electronic device, according to an embodiment of the present disclosure.

Referring to FIG. 3, a first electronic device 300 is shown. The first electronic device 300 may be the first electronic device 101 illustrated in FIG. 1. The first electronic device 300 may include a first power terminal, a second power terminal, a switch unit 305, and a microphone unit 301.

The microphone unit 301 may be connected to the first power terminal and the second power terminal, and the switch unit 305 may be connected to the microphone unit

301 and the first power terminal. For example, the switch unit 305 may be connected to the microphone unit 301 in series. The switch unit 305 may be connected to the first power terminal but may not be connected the second power terminal.

The microphone unit 301 may include at least one microphone 303, a plurality of resistances R4 and R5, a plurality of capacitors C1, C2, and C3, and at least one Zener diode D1. When the first electronic device 101 is connected to the second electronic device 105 (e.g., a portable terminal), the microphone unit 301 may receive a voice signal from a user by using the microphone 303, and transmit the received voice signal to the second electronic device 105. Thereafter, the second electronic device 105 may transmit the received voice signal to the third electronic device 107 (e.g., a portable terminal) through the base station 109.

A value of the fourth resistance R4 may be 1.8 kΩ, and a value of the fifth resistance R5 may be 15 kΩ The capacitance of the first capacitor C1 may be 1 μF, the capacitance of the second capacitor C2 may be 10 pF, and the capacitance of the third capacitor C3 may be 47 pF.

The switch unit 305 may include a plurality of keys 307, 309, and 311. For example, the first key 307 may be a send/end key for providing a function of starting a communication connection or ending a communication. The second key 309 may be a volume-down key for providing a function of turning down the volume. The third key 311 may be a volume-up key for providing a function of turning up the volume. The plurality of keys may be connected to each other in series.

Each of the plurality of keys 307, 309, and 311 may include at least one switch and at least one resistance, and the at least one included switch and the at least one included resistance may be connected in parallel. For example, the first key 307 may include a fourth switch 313 and a sixth resistance 319, and the fourth switch 313 may be connected to the sixth resistance 319 in parallel. As another example, the second key 309 may include a fifth switch 315 and a seventh resistance 321, and the fifth switch 315 may be connected to the seventh resistance 321 in parallel. As another example, the third key 311 may include a sixth switch 317 and an eighth resistance 323, and the sixth switch 317 may be connected to the eighth resistance 323 in parallel.

Values of the sixth to eighth resistances 319, 321, and 323 may correspond to values of the first to third resistances 213, 215, and 217 or the sum thereof, as described with respect to FIG. 2. For example, a value of the sixth resistance 319 may be identical to a value of the first resistance 213 connected to the first switch 207 in series. For example, a value of the sixth resistance 319 may be 50Ω. As another example, a value of the eighth resistance 323 may be identical to a value of the second resistance 215 connected to the third switch 211 in series. For example, the value of the eighth resistance 323 may be 270Ω. As another example, a value of the seventh resistance 321 may be identical to the sum of a value (e.g. 270Ω) of the second resistance 215, connected to the second switch 209 in series, and a value (e.g. 357Ω) of the third resistance 217. For example, the value of the seventh resistance 321 may be 627Ω.

Generally, TDMA noise may be transferred to the second electronic device 105 via the ground of the plurality of switches, as in FIG. 2. In order to solve this problem, in the present disclosure, the switch unit 305 is not connected to the ground so that TDMA noise transferred through the ground may be fundamentally blocked, as shown in FIG. 3.

Further, in the present disclosure, the parallel structure of resistance illustrated in FIG. 2 is changed into a serial structure, as shown in FIG. 3, so that each of the plurality of switches 313, 315, and 317 may maintain a resistance value which is identical to a resistance value corresponding to each of the plurality of switches 207, 209, and 211 in FIG. 2.

Accordingly, in the present disclosure, when a user selects one of the plurality of keys 307, 309, and 311 of the first electronic device 300, the first electronic device 300 may open a switch corresponding to the key, which has been selected by the user, without transferring the TDMA noise. Further, the second electronic device 105 may identify a voltage value corresponding to the opened switch and perform a particular function of the second electronic device 105 corresponding to the identified voltage value.

In the present disclosure, when at least one switch is selected, a value of the at least one resistance connected to the at least one selected switch in parallel may be the entire resistance value of the switch unit 305. For example, when the fifth switch 315 is pressed, the fifth switch 315 is opened and a value (e.g., 627Ω) of the seventh resistance 321 connected to the fifth switch 315 in parallel may be the entire resistance value of the switch unit 305.

For example, when a volume-down key 309 is selected, the second electronic device 105 may receive a voltage value corresponding to the volume-down key, and perform a volume-down function of the second electronic device 105, which corresponds to the received voltage value.

Additionally, while it has been described that the first electronic device 300 includes a volume-up key, a volume-down key, and a send/end key, the present disclosure is not limit thereto. For example, the first electronic device 300 may include a key or the like which can turn off power of the second electronic device 105.

Figure 4:
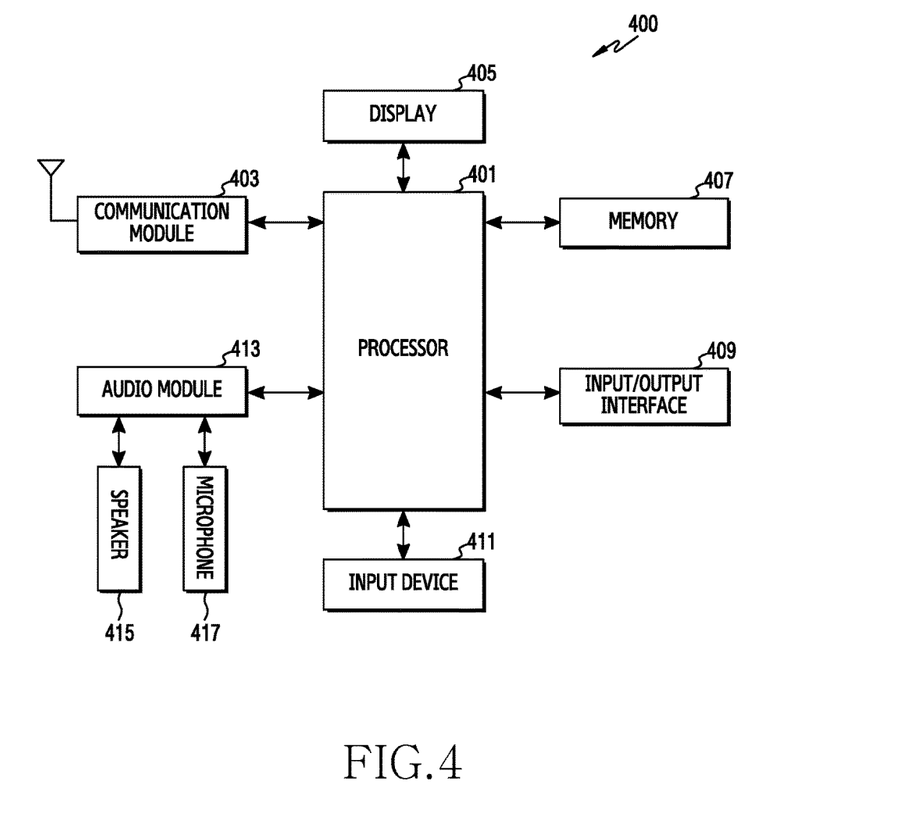
FIG. 4 is a block diagram of a configuration of a second electronic device, according to an embodiment of the present disclosure.

FIG. 4 is a block diagram of a configuration of a second electronic device, according to an embodiment of the present disclosure.

Referring to FIG. 4, a second electronic device 400 is shown. For example, the second electronic device 400 may include the whole or a part of the second electronic device 105 illustrated in FIG. 1. For example, the second electronic device 400 may be a portable terminal or a wearable device, which provides a communication function.

The second electronic device 400 may include a processor 401, a communication module 403, a display 405, a memory 407, an input/output interface 409, an input device 411, an audio module 413, a speaker 415, and a microphone 417.

The processor 401 may include one or more of a CPU, an AP, and a communication processor (CP). The processor 120 may carry out operations or data processing relating to control and/or communication of at least one other element of the second electronic device 400.

The communication module 403 may configure a communication between the second electronic device 400 and an external device (e.g., the third electronic device 107). The communication module 403 may be connected to the base station 109 through wireless or wired communication to communicate with the external device (e.g., the third electronic device 107).

The wireless communication may use at least one of long term evolution (LTE), LTE-advance (LTE-A), code division multiple access (CDMA), wideband CDMA (WCDMA), universal Mobile telecommunications System (UMTS), wireless broadband (WiBro), and global system for mobile (GSM) communications, as a cellular communication protocol.

The display 405 may include a liquid crystal display (LCD), a light-emitting diode (LED) display, an organic light-emitting diode (OLED) display, a micro-electro-mechanical systems (MEMS) display, and an electronic paper display. The display 405 may display various types of contents (e.g., text, images, videos, icons, or symbols). The display 405 may include a touch screen, and receive a touch, gesture, proximity, or hovering input using an electronic pen or a part of a user's body.

The memory 407 may include a volatile memory and/or a non-volatile memory. The memory 407 may store instructions or data related to at least one other element of the second electronic device 400.

The input/output interface 409 may function as an interface that may transfer instructions or data input from a user or another external device (e.g., the first electronic device 101) to other elements of the second electronic device 400. Further, the input/output interface 409 may output instructions or data received from the other elements of the second electronic device 400 to the user or the other external device. The input/output interface 409 may be an interface for connecting an earphone jack, and may perform a connection between the second electronic device 400 and the earphone.

The input device 411 may include a touch panel, a (digital) pen sensor, a key, or an ultrasonic input device. The touch panel may use at least one of a capacitive type, a resistive type, an infrared type, and an ultrasonic type. Also, the touch panel may further include a control circuit. The touch panel may further include a tactile layer to provide a tactile reaction to the user.

The (digital) pen sensor may be a part of the touch panel or may include a separate sheet for recognition.

The key may include a physical button, an optical key, or a keypad.

The ultrasonic input device may sense an ultrasonic wave, which has been generated from an input tool, through the microphone 417, and identify data corresponding to the sensed ultrasonic wave.

The audio module 413 may bilaterally convert a sound and an electrical signal. At least some elements of the audio module 413 may be included in the input/output interface 409. The audio module 413 may process sound information which is input or output through the speaker 415, the microphone 417, an earphone connected through the input/output interface 409, or the like.

The processor 401 may receive a voltage value corresponding to the selection of a key of the first electronic device 101 from the input/output interface 409, and perform a particular function of the second electronic device 400, which corresponds to the received voltage value. For example, when the received voltage value corresponds to a volume-down function of the second electronic device 400, the processor 401 may perform the volume-down function. As another example, when the received voltage value corresponds to a volume-up function, the processor 401 may perform the volume-up function. As another example, when the received voltage value corresponds to a send/end function while a communication is performed between the second electronic device 400 and the third electronic device 107, the processor 401 may perform the send/end function.

Figure 5:
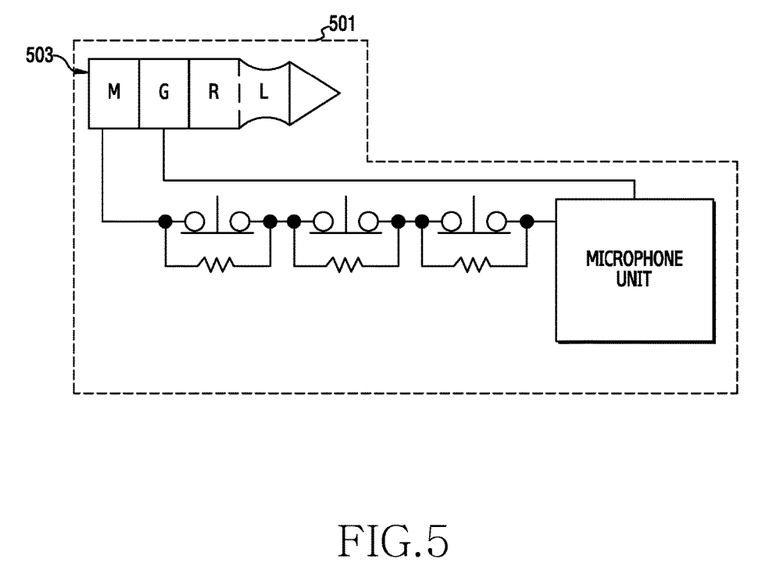
FIG. 5 illustrates a configuration of a connection interface of an earphone, according to an embodiment of the present disclosure.

FIG. 5 illustrates a configuration of a connection interface of an earphone, according to an embodiment of the present disclosure.

Referring to FIG. 5, an earphone 501 is shown. The earphone 501 may be the first electronic device 300 illustrated in FIG. 3. The earphone 501 may be a 4-pole earphone. The earphone 501 may include an earphone jack 503. The earphone jack 503 may be inserted into an input/output interface of the second electronic device 400 (e.g., the input/output interface 409).

The earphone jack 503 includes four terminals, and each of the terminals may be connected to each of elements of the earphone 501. For example, the earphone jack 503 may include a microphone terminal M, a ground terminal G, a right speaker terminal R, and a left speaker terminal L.

The right speaker terminal R may be connected to a right speaker of the earphone 501, and the left speaker terminal L may be connected to a left speaker of the earphone 501. The microphone terminal M may be the first power terminal illustrated in FIG. 3. The ground terminal G may be the second power terminal illustrated in FIG. 3.

The microphone terminal M may be connected to the microphone unit 301 of the earphone 501 or at least one key of the earphone 501 (for example, a volume-up key 311, a volume-down key 309, or a send/end key 307). For example, the ground terminal G may be connected to the microphone unit 301.

As described above, the earphone jack 503 may be inserted into the input/output interface 409 of the second electronic device 400, and may output a signal of each terminal to the input/output interface 409. For example, the earphone 501 may transmit a voice signal of the microphone unit 301 to the input/output interface 409 through the microphone terminal M.

The earphone 501 may include the microphone terminal M and the ground terminal G, the microphone unit 301 may be connected to between the microphone terminal M and the ground terminal G, and at least one key may be connected to the microphone unit 301 and the microphone terminal M. At least one key may include at least one switch and at least one resistance connected to the at least one switch in parallel.

Figure 6:
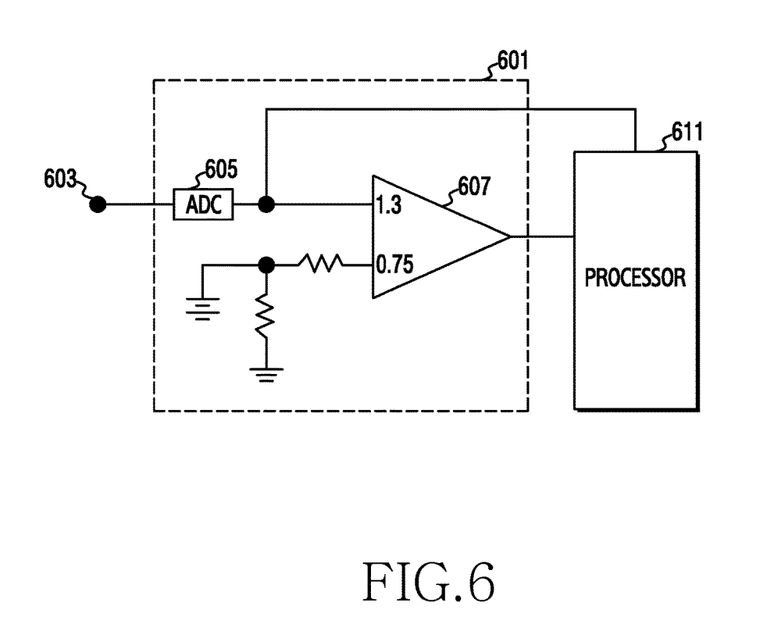
FIG. 6 illustrates a configuration of an input/output interface of a second electronic device, according to an embodiment of the present disclosure.

FIG. 6 illustrates a configuration of an input/output interface of a second electronic device, according to an embodiment of the present disclosure.

Referring to FIG. 6, an input/output interface 601 of the second election device 400 is shown. The input/output interface 601 may be the whole or a part of the input/output interface 409 of the second electronic device 400 illustrated in FIG. 4.

The input/output interface 601 may include an analog digital converter (ADC) 605, which is connected to a microphone terminal M 603 of the first electronic device 300 (e.g., an earphone), and a comparator 607. For example, the ADC 605 may receive an input of an analog signal from the first electronic device 300 through the microphone terminal M 603, convert the input analog signal to a digital signal, and output the digital signal to a processor 611 of the second electronic device 400.

The comparator 607 may compare a voltage value of a signal transferred from the microphone terminal M 603 with a designated reference voltage value (e.g., 0.75 V), and then output the result of the comparison to the processor 611 so that the processor 611 can perform a particular function of the second electronic device 400.

For example, when a plurality of switches of the first electronic device 300 (e.g. fourth to sixth switches 313, 315, and 317) are all closed, an input voltage value of the comparator 607 may be a designated voltage value (e.g. 1.3 V). In this case, a voice signal, which has been received from the microphone unit 301 of the first electronic device 300, may be output to the processor 611.

As another example, when one of the plurality of switches is open, a voltage is applied to a resistance connected to the open switch in parallel, and thus an input voltage value of the comparator 607 may be less than a designated voltage value. Resistances (e.g., the sixth to eighth resistances 319, 321, and 323) connected to switches of the first electronic device 300 in parallel may be designated so that an input voltage value of the comparator 607 is less than or equal to a reference voltage value when the corresponding switches are open. For example, the resistances may have different resistance values so that different voltages are applied to an input terminal of the comparator 607, when different switches are open.

In this case, the comparator 607 may output different comparison results to the processor 611 according to opening of a particular switch (or the selection of a particular switch). For example, when a user presses the sixth switch 317 of the first electronic device 300, the comparator 607 may receive an input voltage which has been dropped from a designated voltage by a voltage applied to the eighth resistance 323, compare the input voltage value with a reference voltage value, and then output the comparison result to the processor 611.

The processor 611 may determine what key is pressed by the user, on the basis of the comparison result, and perform a particular function of the second electronic device 400 on the basis of the determination.

Figure 7:
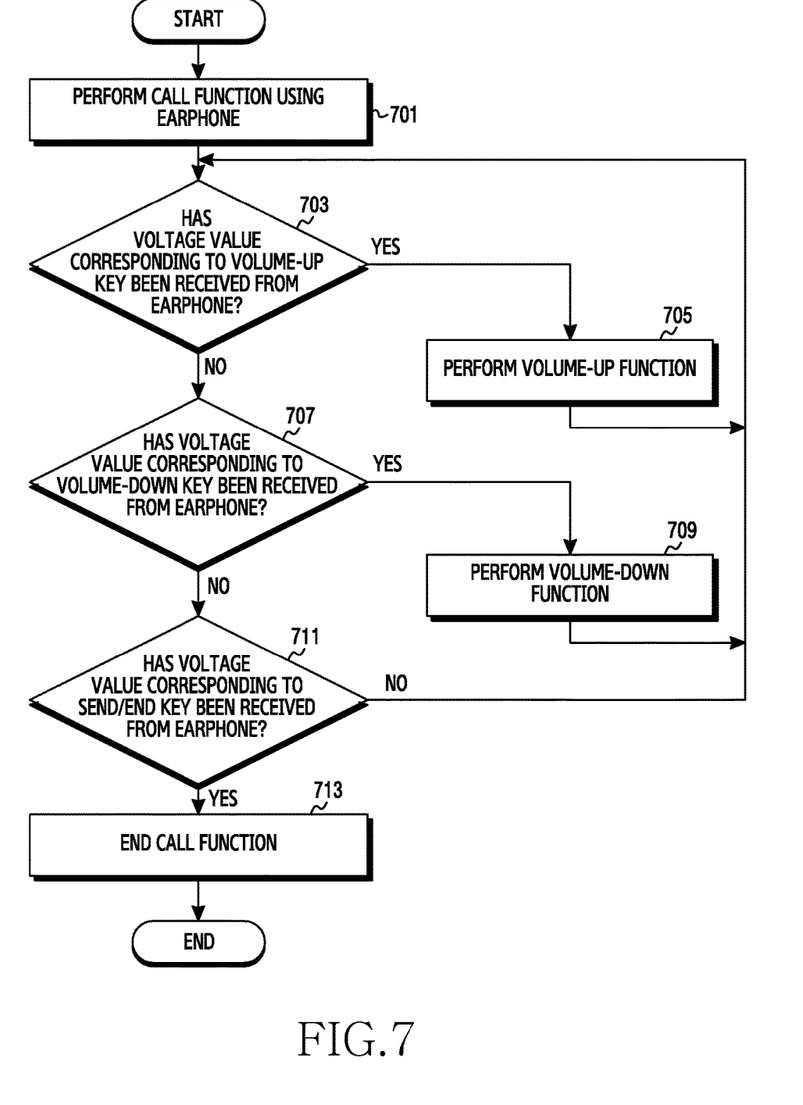
FIG. 7 is a flowchart of a method of performing a function based on the selection of a key of a first electronic device in a second electronic device, according to an embodiment of the present disclosure.

FIG. 7 is a flowchart of a method of performing a function based on the selection of a key of a first electronic device in a second electronic device, according to an embodiment of the present disclosure.

Referring to FIG. 7, in operation 701, the processor 401 of the second electronic device 400 (e.g., a portable terminal) may perform a communication function by using the first electronic device 300 (e.g., an earphone). For example, the processor 401 may receive a voice signal through the first electronic device 300 and transmit the received voice signal to the third electronic device 107. Further, the processor 401 may receive communication signals from the third electronic device 107 and transmit a voice signal among the received communication signals to the first electronic device 300.

In operation 703, the processor 401 may determine whether the comparison result corresponding to a volume-up key of the first electronic device 300 is received. For example, the processor 401 may determine whether a voltage value corresponding to the volume-up key is received, on the basis of the comparison result received from the input/output interface 409. For example, when the comparison result received from the comparator 607 of the input/output interface 601 is a value designated to correspond to the volume-up key, the processor 401 may determine that the voltage value corresponding to the volume-up key has been received.

As a result of the determination, when the voltage value of the volume-up key is received, the processor 401 may proceed to operation 705. Otherwise, the processor 401 may proceed to operation 707.

In operation 705, the processor 401 may perform a volume-up function. For example, the processor 401 may turn up the volume of the audio module 413. After performing the volume-up function, the processor 401 may return to operation 703 in order to sense an input of another key.

In operation 707, the processor 401 may determine whether the comparison result corresponding to a volume-down key is received from the first electronic device 300. For example, when the comparison result received from the comparator 607 is a value designated to correspond to the volume-down key, the processor 401 may determine that a voltage value corresponding to the volume-down key has been received.

As a result of the determination, when the voltage value corresponding to the volume-down key is received, the processor 401 may proceed to operation 709. Otherwise, the processor 401 may proceed to operation 711.

In operation 709, the processor 401 may perform a volume-down function. For example, the processor 401 may turn down the volume of the audio module 413. After performing the volume-down function, the processor 401 may return to operation 703 in order to sense an input of another key.

In operation 711, the processor 401 may determine whether the comparison result corresponding to a send/end key is received from the first electronic device 300. For example, when the comparison result received from the comparator 607 is a value designated to correspond to the send/end key, the processor 401 may determine that a voltage value corresponding to the send/end key has been received.

As a result of the determination, when a communication end signal is received, the processor 401 may proceed to operation 713. Otherwise, the processor 401 may repeatedly perform operation 703.

In operation 713, the processor 401 may end the communication function. For example, the processor 401 may release a communication connection with the third electronic device 107 and terminate a call application which provides the communication function.

Figure 8:
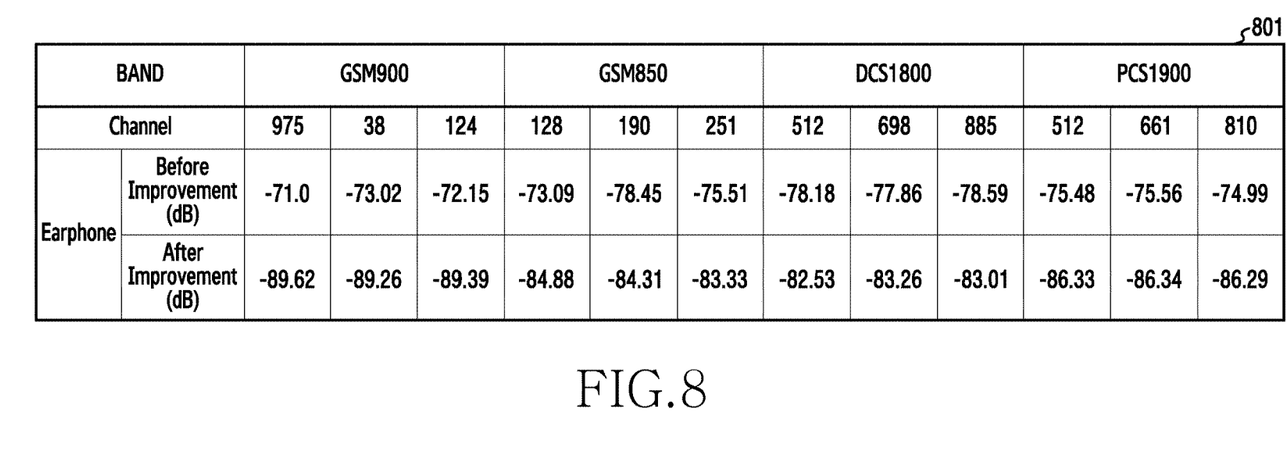
FIG. 8 illustrates a table showing the improvement of performance of a first electronic device, according to an embodiment of the present disclosure.

FIG. 8 illustrates a table showing the improvement of performance of a first electronic device, according to an embodiment of the present disclosure.

Referring to FIG. 8, table 801 is shown. Table 801 shows the result of a measurement of the TDMA noise level of the second electronic device 105 when a key of the first electronic device 101 (e.g., an earphone) connected to the second electronic device 105 is selected while a communication is performed between the second electronic device 105 and the third electronic device 107 in a weak electric field of a second communication system.

Each of GSM900, GSM850, DCS1800, and PCS1900, described in table 801, may be a type of the second communication system. For example, GSM900 may be a second communication system using a 900 MHz band. For example, GSM850 may be a second communication system using an 850 MHz band. For example, DCS1800 may be a second communication system using an 1800 MHz band. For example, PCS1900 may be a second communication system using a 1900 MHz band.

The values before the improvement of an earphone in table 801 show a measured auditory value of a voice signal which the third electronic device 107 receives from the second electronic device 105 and then outputs, when a key of the first electronic device 200 of FIG. 2 is selected while the first electronic device 200 is connected to the second electronic device 105. Here, the output voice signal may include TDMA noise.

The values after the improvement of an earphone in table 801 show a measured auditory value of a voice signal, which the third electronic device 107 receives from the second electronic device 105 and then outputs when a key of the first electronic device 300 of FIG. 3 is selected while the first electronic device 300 is connected to the second electronic device 105. Here, the output voice signal may not include TDMA noise.

Table 801 illustrates that the communication quality of the third electronic device 107 has been improved over the communication quality before the improvement of the first electronic device 101 (e.g., an earphone). For example, in channel 38 of GSM900, the measured auditory value of the third electronic device 107 before the improvement of the first electronic device 101 may be −73.02 dB, and the measured auditory value of the third electronic device 107 after the improvement of the first electronic device 101 may be −89.26 dB. As another example, in channel 698 of DCS1800, the measured auditory value of the third electronic device 107 before the improvement of the first electronic device 101 may be −77.86 dB, and the measured auditory value of the third electronic device 107 after the improvement of the first electronic device 101 may be −83.26 dB.

Accordingly, since the measured auditory value of the third electronic device 107 after the improvement of the first electronic device 101 is lower than the measured auditory value of the third electronic device 107 before the improvement of the first electronic device 101, the communication quality of the third electronic device 107 has been improved over the communication quality before the improvement of the first electronic device 101.

Each of the above-described elements of the electronic device of the present application may be configured with one or more components, and the names of the corresponding elements may vary based on the type of electronic device. The electronic device of the present disclosure may include at least one of the above-described elements, and some of the above-described elements may be omitted from the electronic device, or the electronic device may further include additional elements. Also, some of the elements of the electronic device may be combined into one entity, which may perform functions identical to those of the corresponding elements before the combination.

The term "module", as used herein, may refer to a unit including one of hardware, software, and firmware or a combination thereof. The term "module" may be interchangeably used with the terms "unit", "logic", "logical block", "component", and "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an application-specific integrated circuit (ASIC) chip, a field-programmable gate arrays (FPGA), and a programmable-logic device for performing operations which have been known or are to be developed hereinafter.

According to various embodiments, at least some of the devices (for example, modules or functions thereof) or the method (for example, operations) according to the present disclosure may be implemented by instructions stored in a computer-readable storage medium in a programming module form. The instruction, when executed by the processor 120, may cause the processor 120 to execute the function corresponding to the instruction. The computer-readable storage medium may be the memory 130.

The computer readable recoding medium may include a hard disk, a floppy disk, magnetic media (e.g., a magnetic tape), optical media (e.g., a compact disc read only memory (CD-ROM) and a digital versatile disc (DVD)), magneto-optical media (e.g., a floptical disk), a hardware device (e.g., a read only memory (ROM), a random access memory (RAM), a flash memory), and the like. In addition, the program instructions may include high-level language codes, which can be executed in a computer by using an interpreter, as well as machine codes made by a compiler. The aforementioned hardware device may be configured to operate as one or more software modules in order to perform operations according to various embodiments of the present disclosure, and vice versa.

A module or a programming module according to the present disclosure may include one or more of the aforementioned elements or may further include other additional elements, or some of the aforementioned elements may be omitted. Operations executed by a module, a programming module, or other elements according to various embodiments of the present disclosure may be executed sequentially, in parallel, repeatedly, or in a heuristic manner. Further, some operations may be executed according to another order or may be omitted, or other operations may be added. Various embodiments disclosed herein are provided merely to easily describe technical details of the present disclosure and to help the understanding of the present disclosure, and are not intended to limit the scope of the present disclosure. Therefore, it should be construed that all modifications and changes or modified and changed forms based on the technical idea of the present disclosure fall within the scope of the present disclosure, which is defined, not by the detailed description and embodiments, but by the following claims and their equivalents.

What is claimed is:

1. An apparatus for preventing noise in an electronic device, comprising:
   a microphone unit comprising a microphone, the microphone unit connected to a first power terminal and a second power terminal; and
   a switch unit comprising at least one switch and at least one resistance, the switch unit connected to the first power terminal and the microphone in series,
   wherein the at least one switch is opened when being pressed.

2. The apparatus of claim 1, wherein the first power terminal and the second power terminal are connected to another electronic device in a wired manner.

3. The apparatus of claim 1, wherein the switch unit blocks connection to the second power terminal in order to prevent noise generated by pressing the at least one switch.

4. The apparatus of claim 1, wherein the switch unit blocks connection to the second power terminal in order to prevent noise generated by pressing the at least one switch during communication in a weak electric field of a second communication system.

5. The apparatus of claim 1, wherein the electronic device is one of an earphone and a headphone.

6. The apparatus of claim 1, wherein the noise is time division multiple access (TDMA) noise.

7. The apparatus of claim 1, wherein the switch unit comprises a plurality of switches, which are connected to each other in series.

8. The apparatus of claim 1, wherein the at least one switch is at least one of a send/end switch, a volume-up switch, or a volume-down switch.

9. The apparatus of claim 1, wherein, when the at least one switch is selected, a value of the at least one resistance, which is connected to the at least one selected switch in parallel, is an entire resistance value of the switch unit.

10. An apparatus for preventing noise in an electronic device, comprising:

a microphone unit comprising a microphone, the microphone unit connected to a first power terminal and a second power terminal; and a switch unit comprising at least one switch and at least one resistance, the switch unit connected to the first power terminal and the microphone in series, wherein the switch unit comprises a plurality of switches, which are connected to each other in series.

11. The apparatus of claim 10, wherein the first power terminal and the second power terminal are connected to another electronic device in a wired manner.

12. The apparatus of claim 10, wherein the switch unit blocks connection to the second power terminal in order to prevent noise generated by pressing the at least one switch.

13. The apparatus of claim 10, wherein the switch unit blocks connection to the second power terminal in order to prevent noise generated by pressing the at least one switch during communication in a weak electric field of a second communication system.

14. The apparatus of claim 10, wherein the electronic device is one of an earphone and a headphone.

15. The apparatus of claim 10, wherein the noise is time division multiple access (TDMA) noise.

16. The apparatus of claim 10, wherein the at least one switch is opened when being pressed.

17. The apparatus of claim 10, wherein the at least one switch is at least one of a send/end switch, a volume-up switch, or a volume-down switch.

18. The apparatus of claim 10, wherein, when the at least one switch is selected, a value of the at least one resistance, which is connected to the at least one selected switch in parallel, is an entire resistance value of the switch unit.

19. An electronic device, comprising:

input/output interface; and a processor, the processor configured to:

detect a connection of an external device including a switch unit and a microphone unit, the microphone unit connected to a first power terminal of the external device and a second power terminal of the external device;

perform an application using the external device;

receive, from the external device, a signal indicating a function related to the application; and perform the function related to the application based on the signal, wherein the switch unit is connected to the first power terminal and the microphone unit in series, and wherein at least one switch included in the switch unit is opened when being pressed.

\* \* \* \* \*